United States Patent
Huang et al.

(10) Patent No.: US 9,449,656 B2
(45) Date of Patent: Sep. 20, 2016

(54) MEMORY WITH BIT CELL HEADER TRANSISTOR

(71) Applicant: Taiwan Semiconductor Manufacturing Company, Ltd., Hsin-Chu (TW)

(72) Inventors: I-Han Huang, Tainan (TW); Ming-Yi Lee, Zhudong Township (TW); Chia-En Huang, Xinfeng Township (TW); Fu-An Wu, Hsin-Chu (TW); Jung-Ping Yang, Juibei (TW); Cheng-Hung Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 13/902,439

(22) Filed: May 24, 2013

(65) Prior Publication Data

US 2014/0185394 A1    Jul. 3, 2014

Related U.S. Application Data

(60) Provisional application No. 61/748,674, filed on Jan. 3, 2013.

(51) Int. Cl.
| G11C 7/22 | (2006.01) |
| G11C 7/02 | (2006.01) |
| G11C 5/14 | (2006.01) |
| G11C 11/419 | (2006.01) |

(52) U.S. Cl.
CPC .............. *G11C 7/02* (2013.01); *G11C 5/147* (2013.01); *G11C 11/419* (2013.01)

(58) Field of Classification Search
CPC ........ G11C 7/02; G11C 5/147; G11C 11/419
USPC .......................... 365/154, 226, 227, 228, 229
See application file for complete search history.

(56) References Cited

U.S. PATENT DOCUMENTS

| 5,956,279 A * | 9/1999 | Mo ..................... G11C 29/34 365/185.09 |
| 7,307,899 B2 * | 12/2007 | Khellah ................ G11C 8/12 365/154 |
| 7,961,545 B2 * | 6/2011 | Yamaoka ............. G11C 5/146 365/226 |
| 2008/0117666 A1 * | 5/2008 | Russell ............... G11C 11/412 365/154 |
| 2008/0122525 A1 * | 5/2008 | Lee .............................. 327/537 |

OTHER PUBLICATIONS

Wang, Yih et al., "Dynamic Behavior of SRAM Data Retention and a Novel Transient Voltage Collapse Technique for 0.6V 32nm LP SRAM," IEEE Electron Devices Meeting (IEDM), Dec. 5-7, 2011, 4 pages.

* cited by examiner

*Primary Examiner* — Tha-O H Bui
(74) *Attorney, Agent, or Firm* — Slater Matsil, LLP

(57) ABSTRACT

A memory includes a plurality of bit cells. Each bit cell includes a bit line and a storage cell coupled to the bit line. A header PMOS transistor is coupled to the storage cell in each bit cell. The header PMOS transistor is at least partially turned off during a write operation by a header control signal.

20 Claims, 9 Drawing Sheets

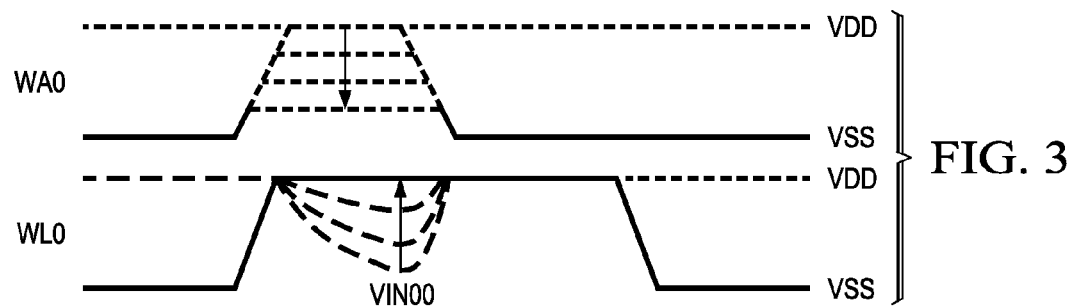
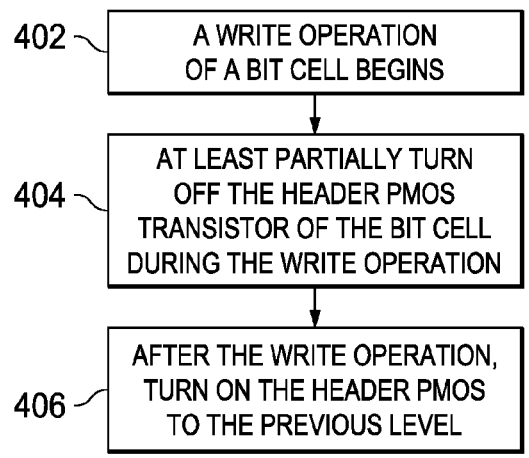
FIG. 3
FIG. 4

US 9,449,656 B2

MEMORY WITH BIT CELL HEADER TRANSISTOR

This application claims priority to U.S. Provisional Application Ser. No. 61/748,674, filed on Jan. 3, 2013, entitled "Memory with Bit Cell Header Transistor," which application is hereby incorporated herein by reference.

TECHNICAL FIELD

The present disclosure relates generally to an integrated circuit and more particularly a memory.

BACKGROUND

Some memory utilizes a write assistance scheme, but an unselected bit cell sharing the write assistance scheme with the selected bit cell may suffer from a worse data hold and static noise margin (SNM) during the write operation of the selected bit cell. A better bit cell structure and method for write assistance are desired.

BRIEF DESCRIPTION OF THE DRAWINGS

Reference is now made to the following descriptions taken in conjunction with the accompanying drawings, in which:

FIG. 3 is a plot of waveforms for the exemplary memory in FIG. 1A according to some embodiments;

FIG. 4 is a flowchart of a method for the exemplary memory in FIG. 1A according to some embodiments;

FIG. 5A is a schematic diagram of an exemplary bias circuit for the memory in FIG. 1A according to some embodiments;

DETAILED DESCRIPTION

Figure 1A:
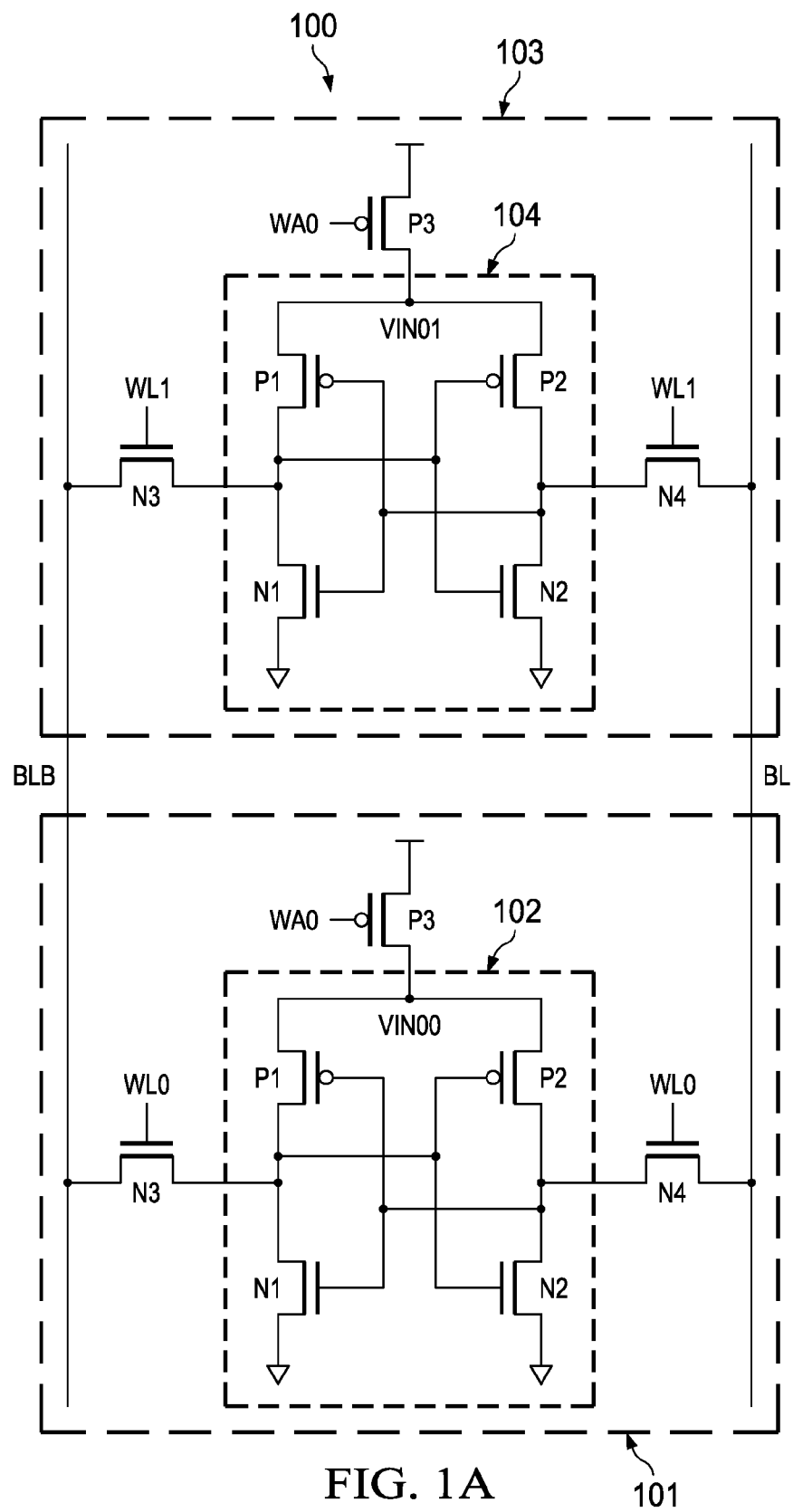
FIG. 1A is a schematic diagram of an exemplary memory with bit cells according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1A is a schematic diagram of an exemplary memory 100 with memory bit cells 101 and 103 according to some embodiments. Each memory bit cell 101 (or 103) includes a bit line BL, a bit line bar BLB, a storage cell 102 (or 104) coupled to the BL and BLB, and a header PMOS transistor P3 coupled to the storage cell 102 (or 104). The storage cell 102 (or 104) comprises PMOS transistors P1 and P2 and NMOS transistors N1 and N2. NMOS transistors N3 and N4 are pass (access) transistors coupled to a word line with control signal WL0 (or WL1). A power supply voltage VDD is provided to the memory 100 with the ground voltage shown as VSS.

Figure 1B:
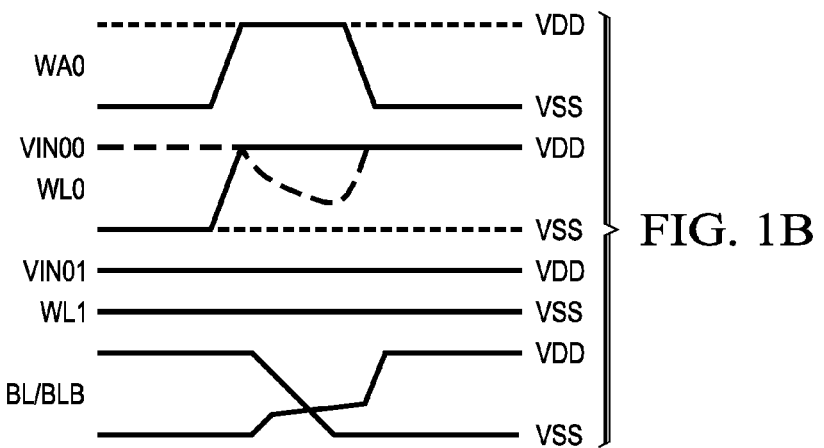
FIG. 1B is a plot of waveforms for the exemplary memory in FIG. 1A according to some embodiments.

The header PMOS transistor P3 is at least partially turned off during a write operation by a header control signal WA0 as described below for a write assist. FIG. 1B is a plot of waveforms for the exemplary memory bit cell in FIG. 1A according to some embodiments. As the write operation begins, the selected word line control signal WL0 is asserted (a logical 1).

The header control signal WA0 also is asserted (a logical 1). The PMOS transistor P3 is turned off by applying WA0 during the write operation, and the write operation (e.g., writing a logical 0 by either BL or BLB) is helped by weakening the pull up current through the PMOS transistor P1 (or P2). In some embodiments, the header control signal WA0 has a shorter duration than the word line control signal WL0 during the write operation.

A voltage level VIN00 at the drain of the PMOS transistor P3 of the bit cell 101 is dropped from a logical 1 due to leakage current because the PMOS transistor P3 is turned off by WA0. The unselected cell word line control signal WL1 is not asserted and the voltage level VIN01 at the drain of the PMOS transistor P3 of the bit cell 103 is unchanged. The write data on BL/BLB is applied to the storage cell 102 in the bit cell 101 through pass transistors N3 and N4 because the WL0 is asserted for the write operation. In FIG. 1B, the waveforms BL/BLB are shown to flip the state (from a logical 0 to a logical 1 and vice versa) for a successful write operation.

Because each bit cell 101 (or 103) in the memory 100 has its respective header PMOS transistor P3 coupled to its storage cell 102 (or 104), the node at the drain of the PMOS transistor P3 are not tied to another bit cell. The voltage level VIN00 is independent from VIN01. Thus, even though VIN00 has a voltage drop in the selected bit cell 101 during the write operation in FIG. 1B from a leakage current, VIN01 in the unselected bit cell 103 shows much less (if any) voltage drop and the write operation in the bit cell 101 does not affect the data in the unselected bit cell 103.

In contrast, if one header PMOS transistor P3 is shared among multiple bit cells such as 101 and 103, the dropped voltage level at VIN00 during a write operation at the bit cell 101 will be tied to VIN01 in the bit cell 103, which can disturb the write operation and/or affect data retention at the unselected bit cell 103.

The write assist scheme of the memory 100 may help to reduce errors in some cases, e.g., when VDD value is relatively small. In one example, when VDD=0.54 V, the exemplary memory 100 performed the write operation without an error, while another memory having one header PMOS transistor shared among multiple bit cells failed the write operation.

In some other examples, the static noise margin (SNM) and write margin (WM) of the exemplary memory 100 showed improvements over a conventional memory. At VDD=1.05 V, the SNM of the memory 100 was 15.8% of VDD, while the SNM of the conventional memory was 10.5% of VDD. At VDD=0.63 V, the SNM of the memory 100 was 10.5% of VDD, while the SNM of the conventional memory was 7.4% of VDD.

Similarly, at VDD=1.05 V, the WM of the memory 100 was 35.7% of VDD, while the WM of the conventional memory was 22.4% of VDD. At VDD=0.63 V, the WM of the memory 100 was 31.9% of VDD, while the WM of the conventional memory was 5.5% of VDD (failed the write test). Also, the exemplary memory 100 with the header PMOS transistor P3 in each bit cell such as 101 and 103 provided successful write assist function even when the write voltage for a logical 0 was higher than 10% of VDD.

In FIG. 1A, multiple bit cells 101 and 103 in the same column have the same header control signal WA0 applied to the header PMOS transistor P3 in each bit cell 101 and 103. In some other embodiments, separate header control signal WA00 and WA01 can be applied respectively, where only the selected bit cell 101 has the WA0 pulse shown in FIG. 1B applied to its header PMOS transistor and do not disturb the unselected bit cell such as 103.

Figure 2A:
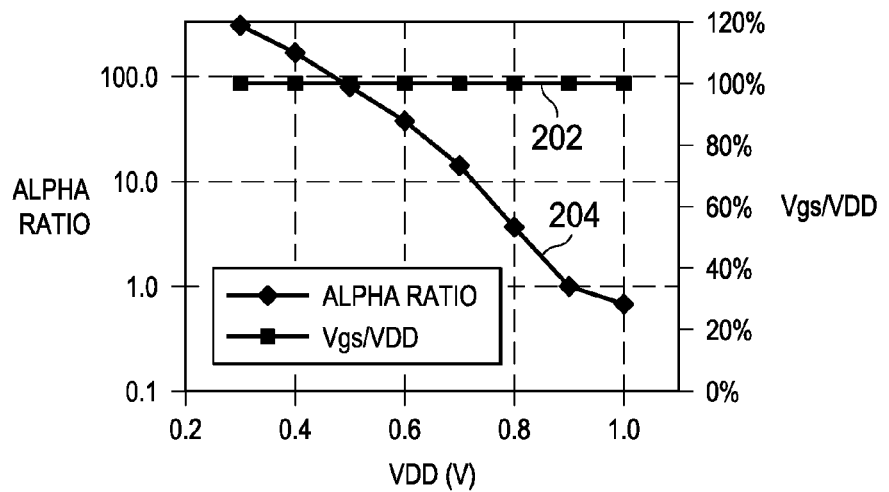
FIGS. 2A-2B are plots of VDD vs. the alpha ratio of the bit cell and Vgs/Vdd of the header PMOS transistor for the exemplary memory in FIG. 1A according to some embodiments.
Figure 2B:
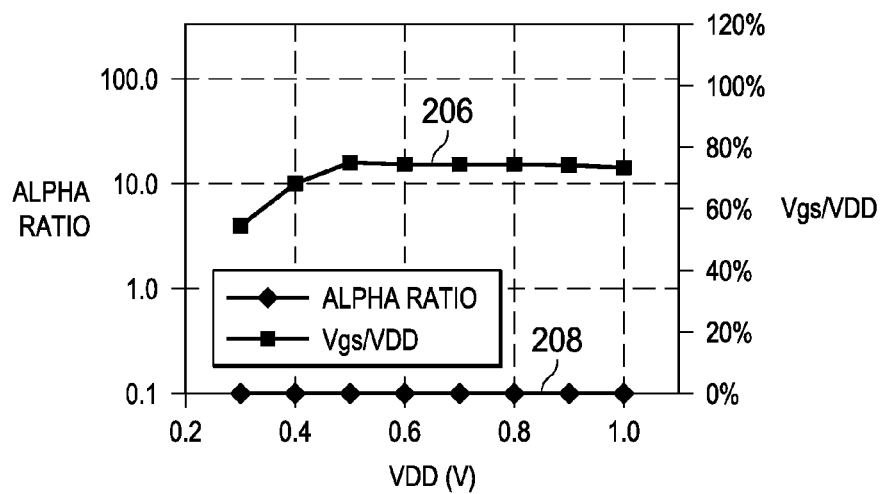

FIGS. 2A-2B are plots of VDD vs. the alpha ratio of the bit cell 101 (or 103) and Vgs/Vdd of the header PMOS transistor P3 for the exemplary memory in FIG. 1A according to some embodiments. The ratio of the pass transistor N3 (or N4) current over the (pull-up) PMOS transistor P1 (or P2) current is referred to as an alpha ratio. In FIG. 2A, the gate-source voltage Vgs of the header PMOS transistor P3 is kept at a constant at Vgs=VDD and the alpha ratio increases with decreasing VDD.

Since a smaller alpha ratio helps the write operation of the bit cells, Vgs is controlled in some embodiments as shown in FIG. 2B so that the alpha ratio is maintained at a certain value during the write operation, e.g., 0.1. This is achieved by applying a certain voltage level of the header control signal WA0 during the write operation. For example, at VDD=0.4 V, the Vgs/VDD ratio is about 70% or 0.7 to maintain the alpha ratio at about 0.1. From WA0=VDD−Vgs, WA0=0.3*VDD=0.12 V.

Thus, by changing the WA0 level, the alpha ratio of the bit cell in the memory 100 can be controlled during the write operation. In some embodiments, the WA0 level during the write operation is selected among a group of discrete voltage levels as described in FIGS. 5A-5B. In some embodiments, the alpha ratio of the bit cell is controlled from about 0.05 to about 0.5. In some embodiments, the alpha ratio is controlled from about 0.05 to about 0.1. In some embodiments, WA0=0.5* VDD during the write operation. Even though FIGS. 2A and 2B are shown as examples, the plots of VDD vs. the alpha ratio and Vgs/VDD can be different from FIGS. 2A and 2B in different embodiments.

FIG. 3 is a plot of waveforms for the exemplary memory 100 in FIG. 1A according to some embodiments. The WA0 level can be controlled in order to maintain a certain alpha ratio value as described above. As the WA0 pulse level is lowered from VDD towards VSS, the header PMOS transistor P3 is less turned off (or more turned on) during the write operation, thus the VIN00 drop during the write operation is reduced. (The VIN00 is shown for illustration purpose only and not drawn to scale.)

FIG. 4 is a flowchart of a method for the exemplary memory 100 in FIG. 1A according to some embodiments. At step 402, a write operation of the bit cell 101 (in the memory 100) begins. The word line control signal WL0 is asserted as shown in FIG. 1B.

At step 404, the header PMOS transistor P3 is at least partially turned off during the write operation by applying the header control signal WA0. The level of the WA0 pulse can control the degree of turning off the PMOS transistor P3, which controls the alpha ratio as described above. The WA0 level can be less than the power supply voltage VDD, e.g., ½ VDD, etc. In some embodiments, the WA0 level during the write operation is selected among a group of discrete voltage levels as described in FIGS. 5A-5B.

At step 406, the header PMOS transistor P3 is turned on to the previous level after the write operation by returning the level of the WA0 to the previous level (e.g., logical 0 or VSS in FIG. 1B).

FIG. 5A is a schematic diagram of an exemplary bias circuit 500 for the memory in FIG. 1A according to some embodiments. NMOS transistors N5, N6, N7, and N8 with a threshold voltage Vthn and PMOS transistors P5, P6, P7, and P8 with a threshold voltage Vthp can be used to supply a bias voltage for the header control signal WA0 of the memory 100 in FIG. 1A with multiple levels based on the threshold voltages Vthn and Vthp of the transistors.

For example, when WAC_N is a logical 0, NMOS transistors N5 and N6 are turned on to provide bias voltages (VDD−Vthn) at the node VN1, and (VDD−2Vthn) at the node VN2. When WAC_N is a logical 1, NMOS transistors N7 and N8 are turned on and the output voltages are a logical 0 or VSS. Likewise, when WAC_P is a logical 0, PMOS transistors P7 and P8 are turned on to provide bias voltages Vthp at the node VP1, and 2Vthp at the node VP2. When WAC_P is a logical 1, PMOS transistors P5 and P6 are turned on and the output voltages are a logical 1 or VDD.

Figure 5B:
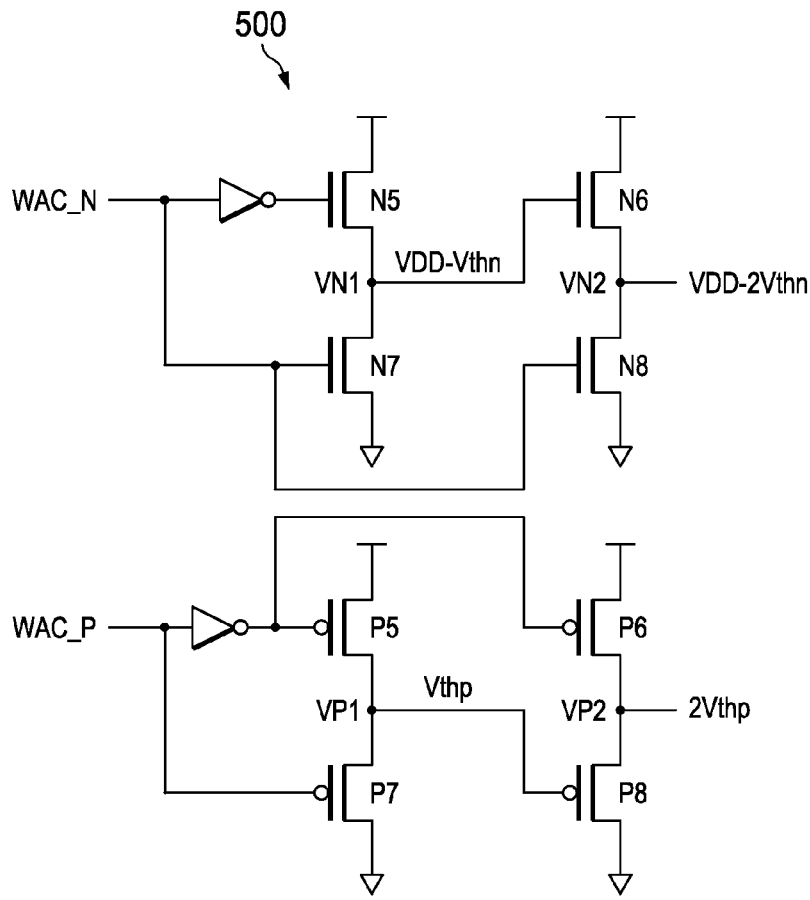
FIG. 5B is a plot of waveforms for the exemplary bias circuit in FIG. 5A according to some embodiments.
Figure 5B:
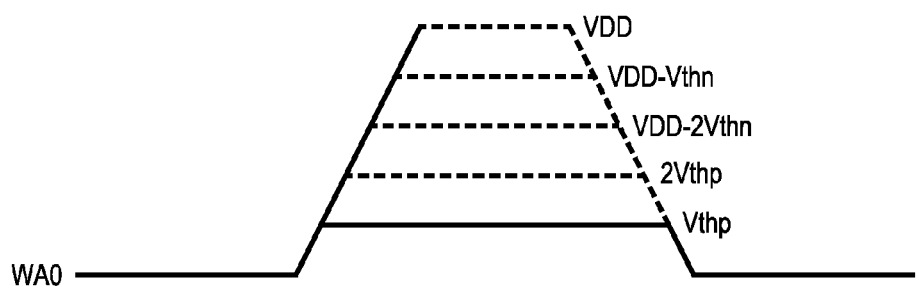

Thus, WA0 can be provided with multiple levels based on the transistor threshold voltage as shown in FIG. 5B, which is a plot of waveforms for the exemplary bias circuit in FIG. 5A according to some embodiments. The power supply voltage VDD ranges from 0.6 V to 1.4 V, and the transistor threshold voltages range from 0.1 V to 0.4 V in some embodiments. The voltage levels of the header control signal WA0 can be provided by any other suitable methods or circuits and can be discrete levels or continuous levels.

Figure 6A:
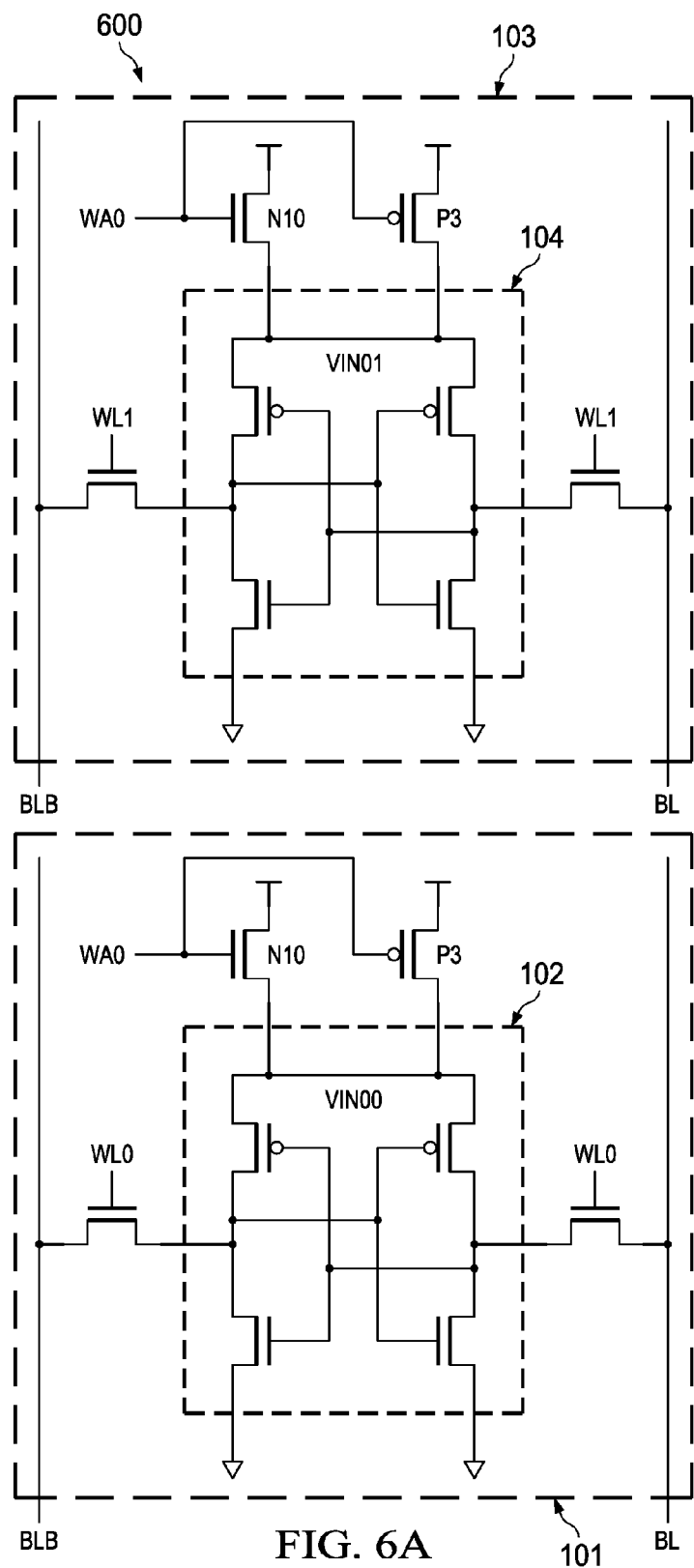
FIG. 6A is a schematic diagram of another exemplary memory according to some embodiments.

FIG. 6A is a schematic diagram of another exemplary memory 600 according to some embodiments. The memory 600 is similar to the memory 100 in FIG. 1A except that an NMOS transistor N10 is coupled to the storage cell 102 (or 104) in parallel with the header PMOS transistor P3. The NMOS transistor N10 is also controlled by the same header control signal WA0 and provides internal node self-clamping for the voltage level VIN00 (or VIN01).

Figure 6B:
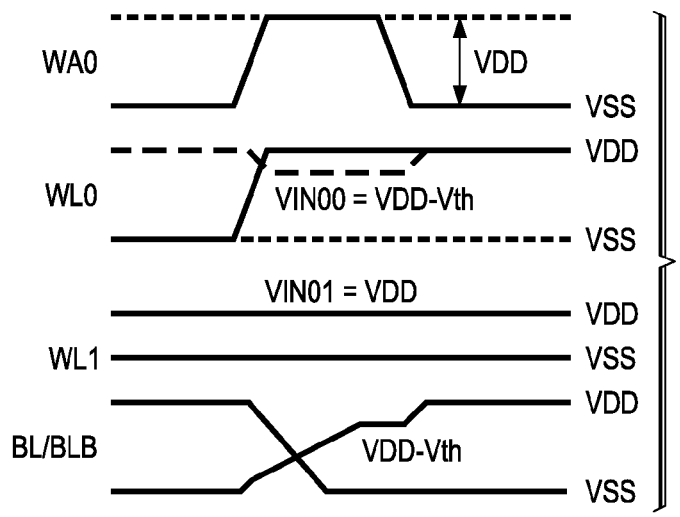
FIG. 6B is a plot of waveforms for the exemplary memory in FIG. 6A according to some embodiments.

FIG. 6B is a plot of waveforms for the exemplary memory 600 in FIG. 6A according to some embodiments. For the memory 600, the voltage level VIN00 of the drain of the header PMOS transistor P3 is maintained by the NMOS transistor N10 at (VIN00=VDD−Vth) during the write operation, which limits the voltage drop of VIN00 . The Vth is the threshold voltage of the NMOS transistor N10.

Figure 7B:
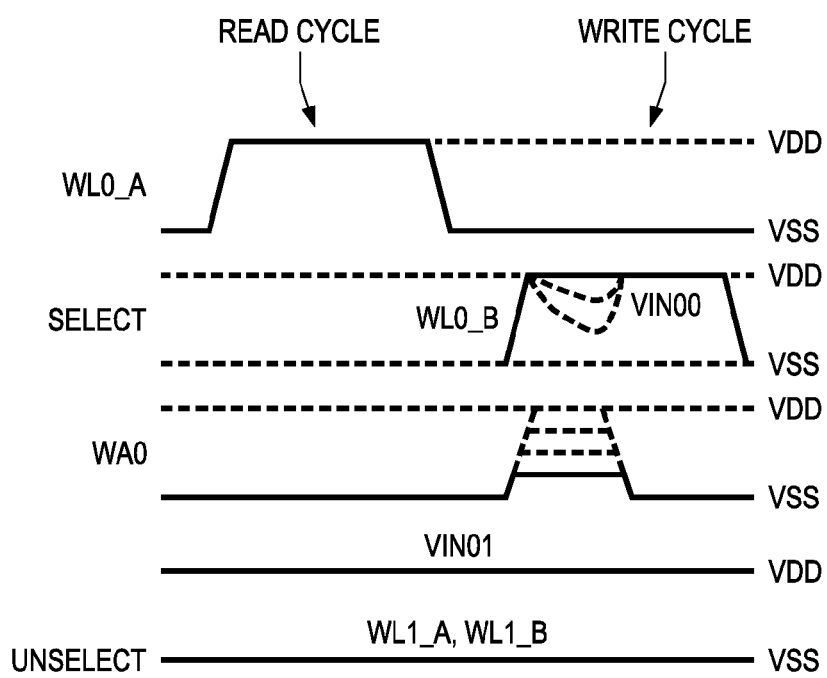
FIG. 7B is a plot of waveforms for the exemplary memory in FIG. 7A according to some embodiments.
Figure 7A:
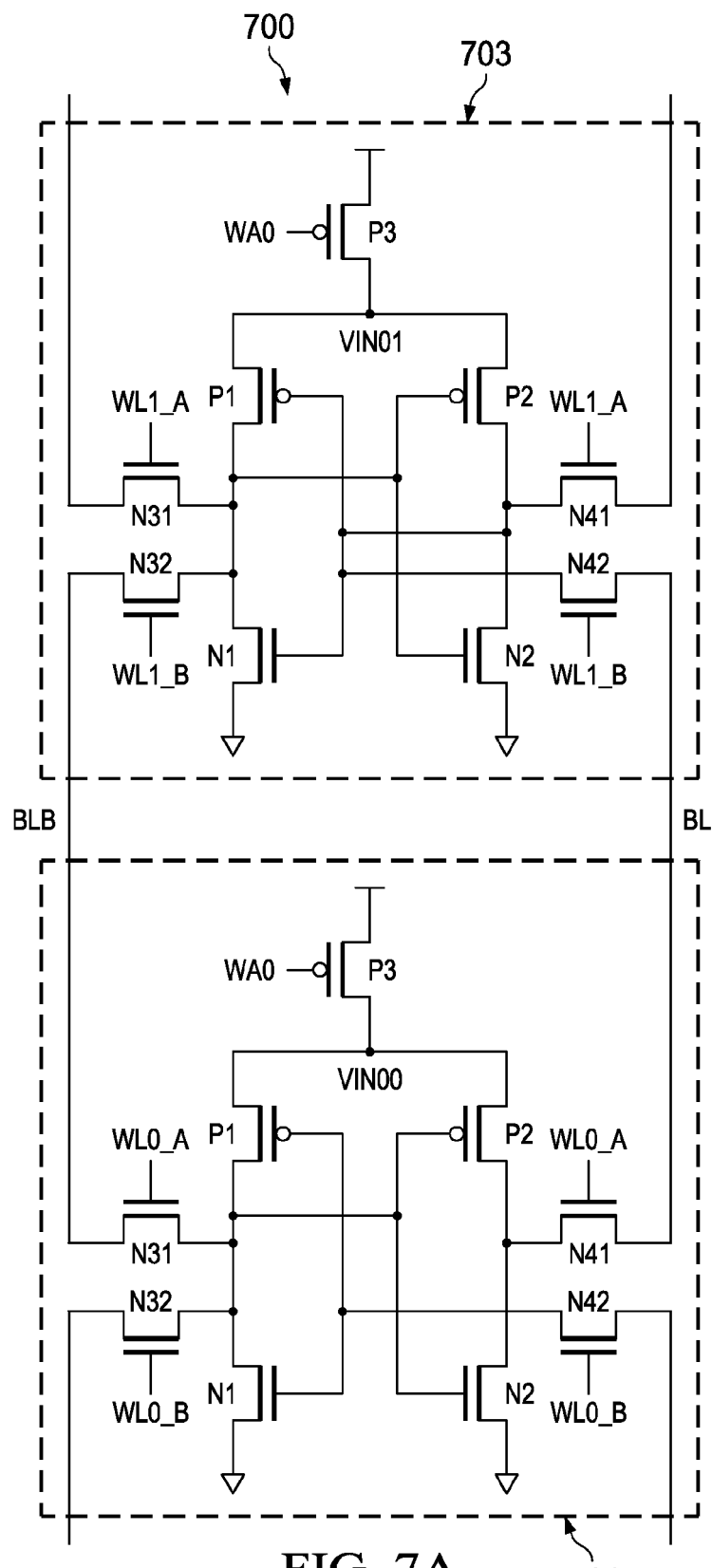
FIG. 7A is a schematic diagram of yet another exemplary memory according to some embodiments.

FIG. 7A is a schematic diagram of yet another exemplary memory 700 according to some embodiments. The memory 700 is a dual port memory, with word line control signals WL0_A (or WL1_A) coupled to pass transistors N31 and N41, and WL0_B (or WL1_A) coupled to pass transistors N32 and N42 separately, controlling a read operation and a write operation of the bit cell 701 (or 703) respectively. The write assist operation of the memory 700 using the header PMOS transistor P3 is similar to the memory 100 in FIG. 1A as described above.

FIG. 7B is a plot of waveforms for the exemplary memory 700 in FIG. 7A according to some embodiments. During a read operation for a selected bit cell 701, the word line control signal WL0_A in bit cell 701 is asserted. During a write operation, WL0_B is asserted and WA0 is asserted at a desired level for the write assist as shown in FIG. 7B.

For an unselected bit cell 703 during the write operation of the bit cell 701, the voltage level of VIN01 does not show as much voltage drop as VIN00 during the write operation, which helps to retain the data in the bit cell 703. The signal levels of the header control signal WA0 can be adjusted for a desired alpha ratio similar to the memory 100 in FIG. 1A as described above.

Figure 8A:
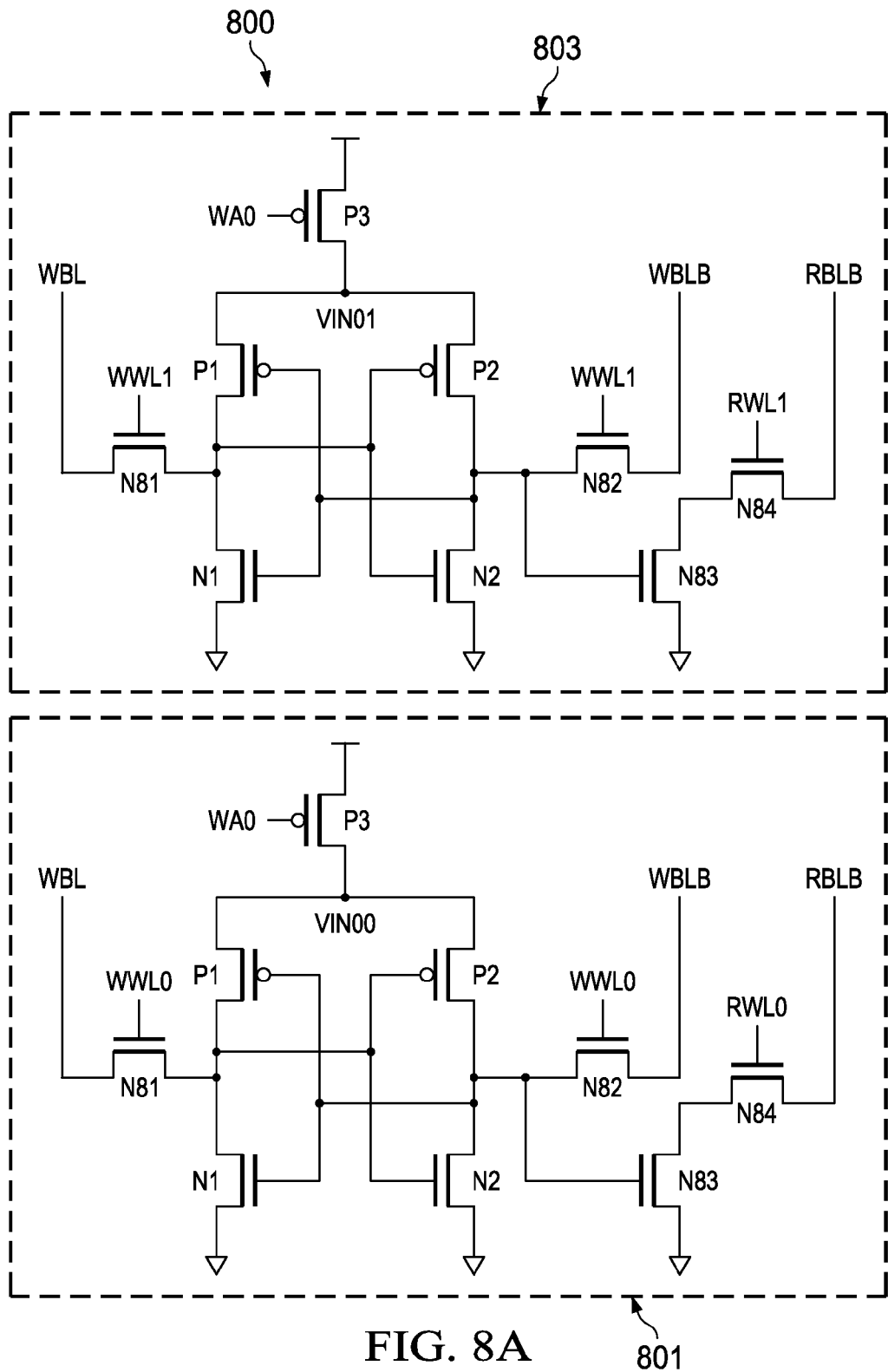
FIG. 8A is a schematic diagram of yet another exemplary memory according to some embodiments.

FIG. 8A is a schematic diagram of yet another exemplary memory 800 according to some embodiments. The memory 800 is a 8T2P (8 transistors 2 ports) memory, with a separate word line control signals WWL0 (or WWL1) for a write operation coupled to pass transistors N81 and N82, and RWL0 (or RWL1) for a read operation coupled to a pass transistor N84 that is connected to a separate Read BLB (RBLB) and an NMOS transistor N83. The general operation of an 8T2P memory is known in the art. The write assist operation of the memory 800 using the header PMOS transistor P3 is similar to the memory 100 in FIG. 1A as described above.

Figure 8B:
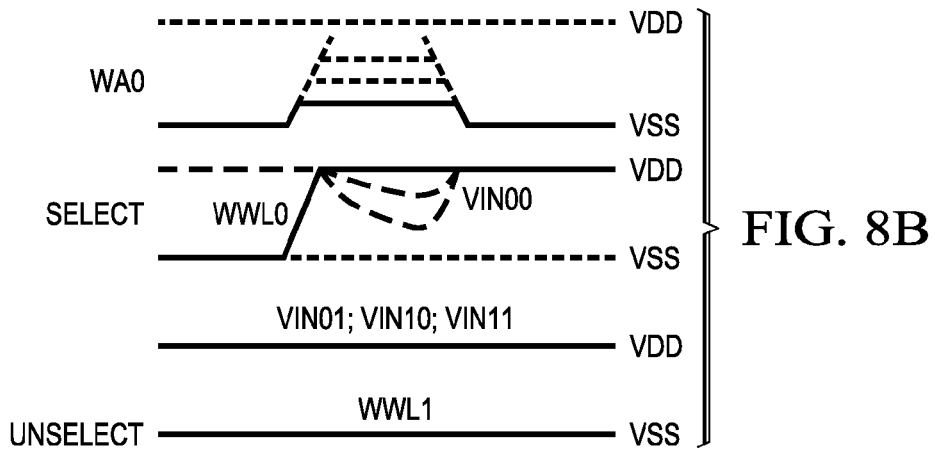
FIG. 8B is a plot of waveforms for the exemplary memory in FIG. 8A according to some embodiments.

FIG. 8B is a plot of waveforms for the exemplary memory in FIG. 8A according to some embodiments. During a write operation for a selected bit cell 801, WWL0 is asserted and WA0 is asserted at a desired level for the write assist as shown in FIG. 8B. For an unselected bit cell 803, the voltage level of VIN01 does not show as much voltage drop as VIN00 during the write operation of the bit cell 801, which helps to retain the data in the bit cell 803. The signal levels of the header control signal WA0 can be adjusted for a desired alpha ratio similar to the memory 100 in FIG. 1A as described above.

Figure 9:
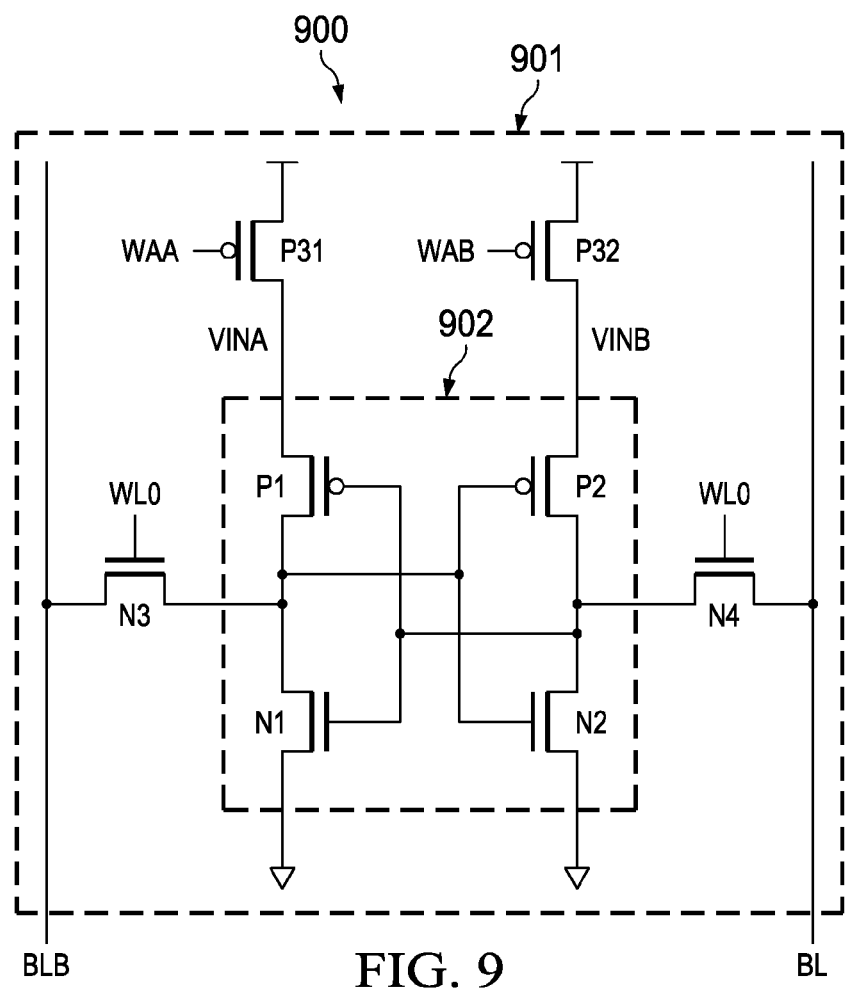
FIG. 9 is a schematic diagram of yet another exemplary memory according to some embodiments.

FIG. 9 is a schematic diagram of yet another exemplary memory 900 according to some embodiments. The memory 900 with a bit cell 901 is similar to the memory 100 except that separate header PMOS transistors P31 and P32 are coupled to PMOS transistor P1 and P2 respectively on each sides of the storage cell 902. The write assist in the memory 900 is similar to the memory 100 in FIG. 1A except that the header PMOS transistor P31 or P32 on the side of writing a logical 0 is provided with a header control signal pulse WAA or WAB similar to the header control signal WA0 pulse shown in FIG. 1B.

For example, the header control signal pulse is asserted on WAB for writing a logical 0 on BL, while the header control signal pulse is asserted on WAA for writing a logical 0 on the BLB. The signal levels of the header control signal WAA and WAB can be adjusted for a desired alpha ratio similar to the memory 100 in FIG. 1A as described above.

According to some embodiments, a memory includes a plurality of bit cells. Each bit cell includes a bit line and a storage cell coupled to the bit line. A header PMOS transistor is coupled to the storage cell in each bit cell. The header PMOS transistor is at least partially turned off during a write operation by a header control signal.

According to some embodiments, a method for a memory with a plurality of bit cells includes applying a word line control signal to a word line of a bit cell of the plurality of bit cells for a write operation. Each bit cell includes a storage cell and a header PMOS transistor coupled to the storage cell. The header PMOS transistor is at least partially turned off during the write operation.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A memory including a plurality of bit cells, each bit cell comprising:
   a bit line;
   a first storage cell comprising a first plurality of PMOS transistors;
   a second storage cell comprising a second plurality of PMOS transistors, wherein the first storage cell and the second storage cell are coupled to the bit line;
   a first pass transistor coupled to each of the first plurality of PMOS transistors of the first storage cell;
   a second pass transistor coupled to each of the second plurality of PMOS transistors of the second storage cell;
   a first header PMOS transistor coupled to each of the first plurality of PMOS transistors of the first storage cell and a second header PMOS transistor coupled to each of the second plurality of PMOS transistors of the second storage cell;
   a common supply voltage line coupled to the first storage cell and the second storage cell, wherein the first header PMOS transistor is interjacent the common supply voltage line and each of the first plurality of PMOS transistors of the first storage cell, and wherein the second header PMOS transistor is interjacent the common supply voltage line and each of the second plurality of PMOS transistors of the second storage cell; and
   a header control circuit coupled to provide a first header control signal to the first header PMOS transistor and a second header control signal to the second header PMOS transistor, wherein the header control circuit is configured to provide the first header control signal such that a ratio of a first pass current of the first pass transistor to a first pull-up current of the first plurality of PMOS transistors is between about 0.05 to about 0.1 during a write operation of the first storage cell, wherein the header control circuit is configured to provide the second header control signal such that a ratio of a second pass current of the second pass transistor to a second pull-up current of the second plurality of PMOS transistors is between about 0.05 to about 0.1 during a write operation of the second storage cell.

2. The memory of claim 1, wherein bit cells are organized in columns and bit cells in the same column are configured to have the same header control signal.

3. The memory of claim 1, wherein a voltage level of the first header control signal is less than a power supply voltage level during the write operation.

4. The memory of claim 3, wherein the voltage level of the first header control signal is half of the power supply voltage level during the write operation.

5. The memory of claim 1, wherein a voltage level of the first header control signal during the write operation is selected from among a group of discrete voltage levels.

6. The memory of claim 5, wherein a difference among the group of discrete voltage levels is based on a threshold voltage of a transistor in a bias circuit.

7. The memory of claim 1, further comprising a word line controlled by a word line control signal.

8. The memory of claim 7, wherein the first header control signal has a shorter pulse duration than the word line control signal during the write operation.

9. The memory of claim 1, further comprising an NMOS transistor coupled to the first storage cell in parallel with the first header PMOS transistor, wherein the NMOS transistor is controlled by the first header control signal.

10. The memory of claim 9, wherein a voltage level of a drain of the first header PMOS transistor is maintained at a power supply voltage minus a threshold voltage of the NMOS transistor during the write operation.

11. The memory of claim 1, wherein the first header PMOS transistor is configured to be at least partially turned off during the write operation of the first storage cell by the first header control signal, and the second header PMOS transistor is configured to be at least partially turned off during the write operation of the second storage cell by the second header control signal.

12. A method comprising:
applying a word line control signal to a word line coupled to a selected bit cell of a plurality of bit cells for a write operation, the plurality of bit cells coupled to a common bit line, wherein each bit cell comprises a storage cell, one header PMOS transistor coupled to the storage cell, and a pass transistor coupled to the storage cell and the word line, wherein the storage cell comprises a pull-up transistor; and
at least partially turning off the header PMOS transistor of the selected bit cell during the write operation of the selected bit cell while leaving turned on the header PMOS transistors of the plurality of bit cells that are not selected, wherein the selected bit cell is not coupled to the header PMOS transistors of the plurality of bit cells that are not selected, wherein at least partially turning off the header PMOS transistor comprises applying a header control signal to the header PMOS transistor such that a ratio of current through the pass transistor to current through the pull-up transistor is between about 0.05 and about 0.1.

13. The method of claim 12, wherein the plurality of bits cells are organized in columns, and the same header control signal is applied to each header PMOS transistor in a respective bit cell of the plurality of bit cells in the same column.

14. The method of claim 12, wherein a voltage level of the header control signal is less than a power supply level during the write operation.

15. The method of claim 12, wherein a voltage level of the header control signal is half of a power supply voltage level during the write operation.

16. The method of claim 12, wherein a voltage level of the header control signal during the write operation is selected from among a group of discrete voltage levels.

17. The method of claim 12, further comprising maintaining a voltage level of a drain of the header PMOS transistor at a power supply voltage minus a threshold voltage of an NMOS transistor during the write operation, wherein the NMOS transistor is coupled in parallel with the header PMOS transistor in the bit cell.

18. The method of claim 12, wherein the storage cell comprises a plurality of PMOS transistors, wherein the header PMOS transistor is coupled to source terminals of each of the plurality of PMOS transistors, and the pass transistor is coupled to a drain terminal of at least one of the plurality of PMOS transistors.

19. The method of claim 12, wherein a voltage level of the header control signal during the write operation is about 0.12 volts.

20. A memory including a plurality of bit cells, each bit cell comprising:
a bit line;
a word line controlled by a word line control signal;
a storage cell coupled to the bit line and the word line, the storage cell comprising a plurality of PMOS transistors;
a header PMOS transistor coupled to each of the plurality of PMOS transistors of the storage cell and controlled by a header control signal; and
an NMOS transistor coupled to each of the plurality of PMOS transistors of the storage cell in parallel with the header PMOS transistor, wherein the NMOS transistor is controlled by the header control signal;
wherein the header PMOS transistor is at least partially turned off during a write operation by the header control signal, and wherein the header control signal has a shorter pulse duration than the word line control signal during the write operation;
the memory further comprising a common voltage supply line coupled to each bit cell, wherein the header PMOS transistor of each bit cell is interjacent the common voltage supply line and the plurality of PMOS transistors of the storage cell.

* * * * *